(12) United States Patent
Rose

(10) Patent No.: US 8,873,224 B2
(45) Date of Patent: Oct. 28, 2014

(54) PARKING LOT POWER PEDESTAL

(71) Applicant: Stanley J. Rose, Calmar (CA)

(72) Inventor: Stanley J. Rose, Calmar (CA)

( * ) Notice: Subject to any disclaimer, the term of this patent is extended or adjusted under 35 U.S.C. 154(b) by 172 days.

(21) Appl. No.: 13/671,799

(22) Filed: Nov. 8, 2012

(65) Prior Publication Data

US 2014/0096994 A1  Apr. 10, 2014

Related U.S. Application Data

(63) Continuation-in-part of application No. 29/434,007, filed on Oct. 9, 2012, now Pat. No. Des. 699,202.

(51) Int. Cl.
*H02B 1/26* (2006.01)
*H05K 5/06* (2006.01)

(52) U.S. Cl.
CPC ...................................... *H05K 5/069* (2013.01)
USPC ............ 361/641; 361/601; 361/675; 174/38; 174/50.52

(58) Field of Classification Search
USPC ................. 361/601–602, 610, 627, 637, 640, 361/658–659, 664–668, 676–678, 361/679.46–679.54, 688–722, 752, 831
See application file for complete search history.

(56) References Cited

U.S. PATENT DOCUMENTS

| | | | |
|---|---|---|---|
| 1,709,190 A | 4/1929 | Rank et al. | |
| 3,234,903 A | 2/1966 | Vara, Sr. | |
| 3,450,951 A * | 6/1969 | Boyle | 361/664 |
| 4,137,662 A | 2/1979 | Baumer | |
| 4,569,499 A | 2/1986 | Seely | |
| 4,691,892 A | 9/1987 | Grewe et al. | |
| 5,128,688 A * | 7/1992 | West | 343/766 |
| 5,379,716 A | 1/1995 | Helland | |
| 5,684,493 A * | 11/1997 | Floyd et al. | 343/709 |
| 5,726,507 A * | 3/1998 | Tipton | 307/147 |
| 5,788,405 A | 8/1998 | Beard | |
| 5,803,353 A | 9/1998 | Fisher | |
| 5,838,078 A * | 11/1998 | Tipton | 307/147 |
| 6,252,764 B1 * | 6/2001 | Benson | 361/625 |
| 6,266,233 B1 * | 7/2001 | O'Regan | 361/659 |
| 6,795,300 B1 * | 9/2004 | Holley | 361/601 |
| 7,497,140 B2 * | 3/2009 | Blackwelder et al. | 74/89.28 |
| 7,570,481 B2 * | 8/2009 | Seff et al. | 361/624 |
| 8,089,747 B2 * | 1/2012 | Storck et al. | 361/641 |
| 2005/0257488 A1 * | 11/2005 | Higgins | 52/731.1 |
| 2007/0284370 A1 * | 12/2007 | Dively | 220/3.8 |

* cited by examiner

*Primary Examiner* — Courtney Smith
(74) *Attorney, Agent, or Firm* — Davis & Bujold, PLLC; Michael J. Bujold

(57) ABSTRACT

A parking lot power pedestal is described which has a single spring attaching a tubular body to a base. The spring flexes in response to a blow to enable the tubular body to be angularly offset relative to the base and the spring resiliently returns to its original state to reposition the tubular body in a position extending vertically relative to the base. The spring has a first end providing a weather seal with a central bore of the tubular body. The spring has a second end providing a weather seal surrounding an opening in the base. The spring is tightly wound to provide a weather seal for a central passage defined by the spring through which wires pass.

1 Claim, 3 Drawing Sheets

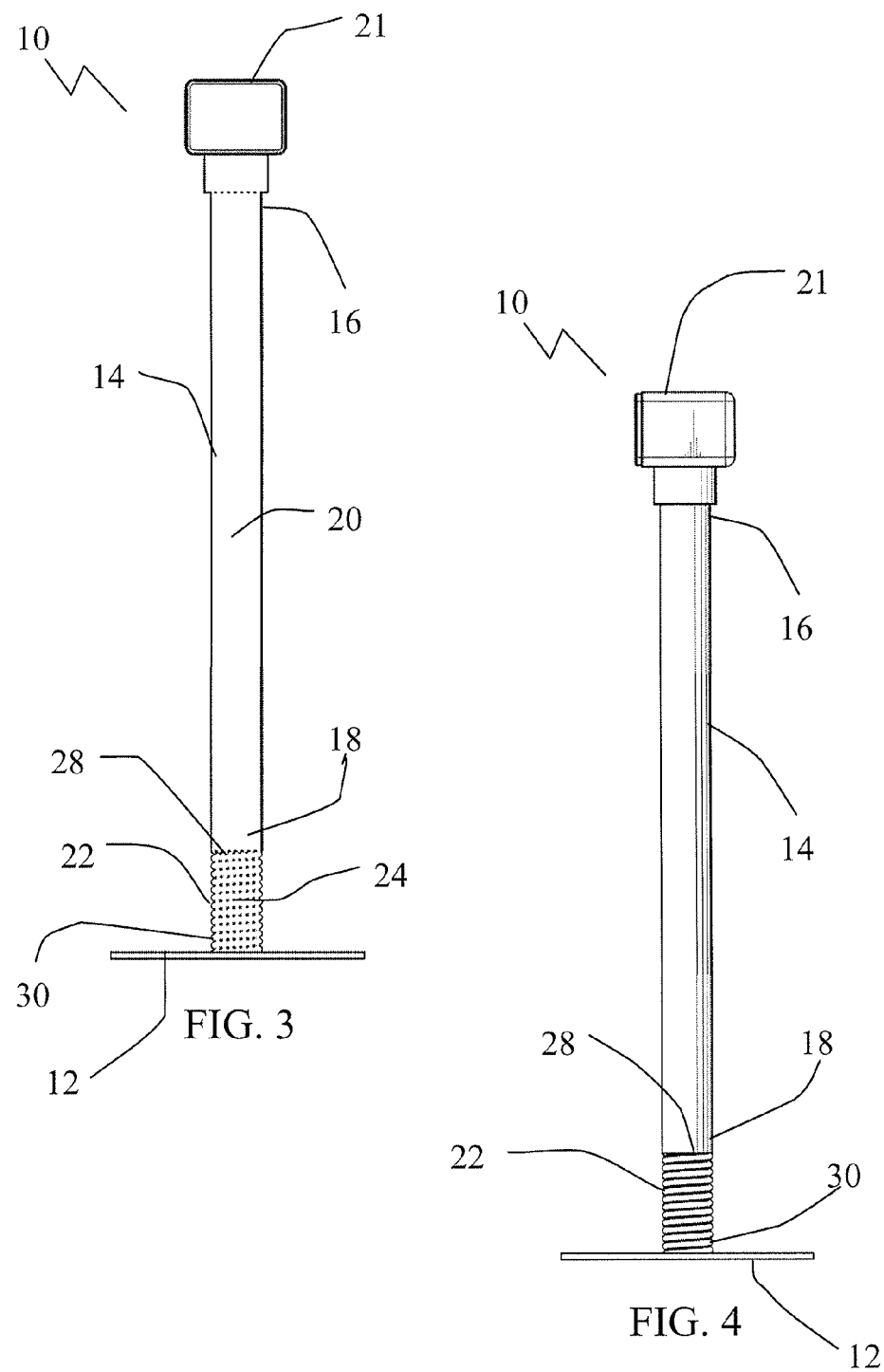

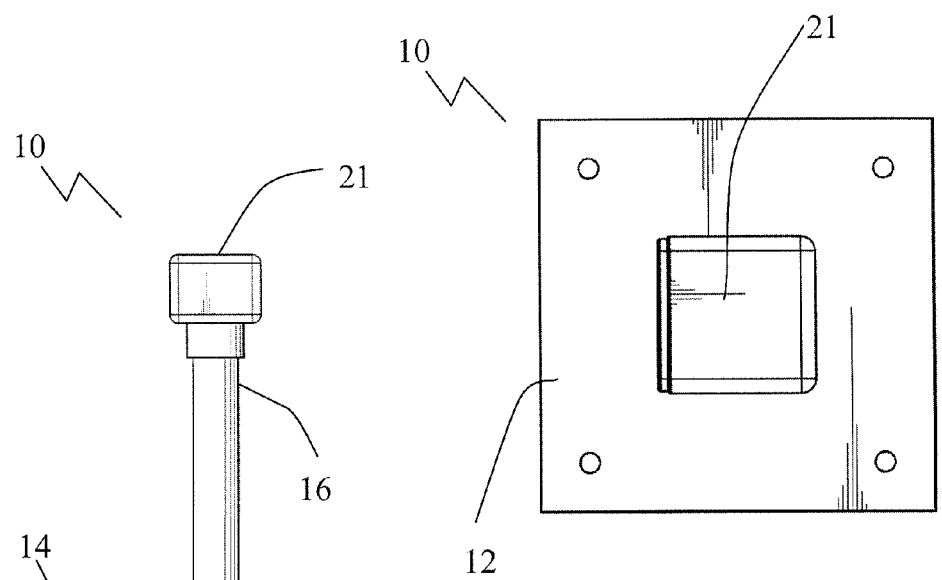
FIG. 6
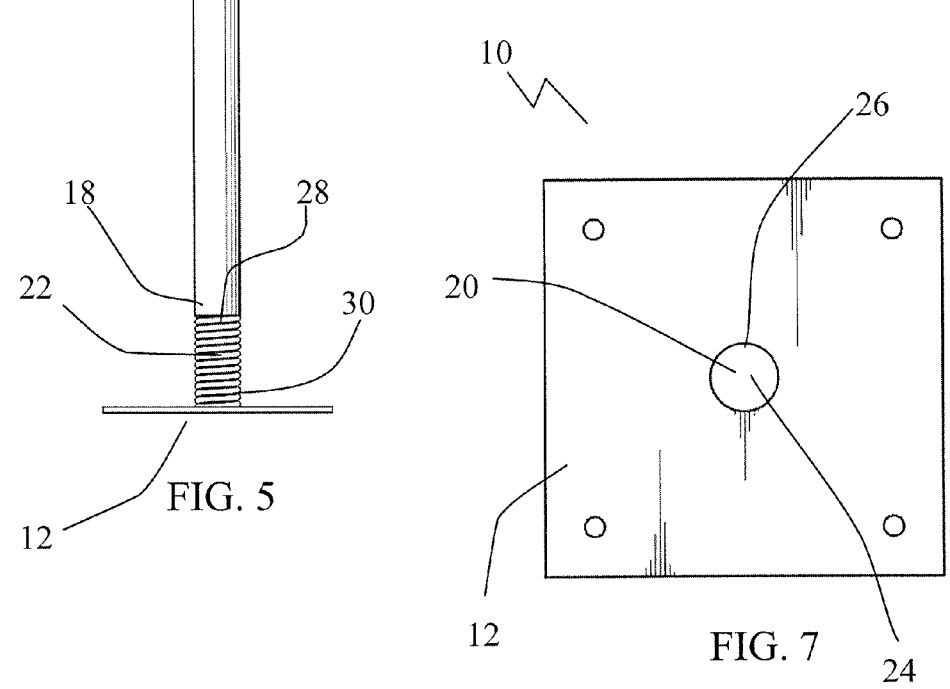
FIG. 5
FIG. 7

PARKING LOT POWER PEDESTAL

FIELD

There is described a power pedestal that is used to provide power to facilitate plugging in parked vehicles, such as electric vehicles or vehicles with block heaters that are parked outdoors in extremely cold winter conditions.

BACKGROUND

As with all electrical devices, a parking lot power pedestal must meet rigorous safety standards. The wires carrying electricity must be protected from animals such as rodents and birds that might otherwise gnaw or peck away at insulated covering on the wires. The wire carrying electricity must be protected from weather and ultra violet radiation which would otherwise degrade the insulated covering on the wires.

It is possible to position a parking lot power pedestal far enough away from a parking stall, as to make it impossible for an automobile to strike the parking lot power pedestal. However, in order to fit the maximum number of automobiles possible into a parking lot area, each parking lot power pedestal is being installed relatively close to each parking stall. As a result, parking lot power pedestals are being inadvertently struck by automobiles and damaged. In some cases, the insulated covering on the wires remains intact, but is left exposed to animals, weather and ultra violet radiation. In more severe cases, the wires supplying power are severed or the insulated covering on the wires is partially torn away leaving a bare spot. When this occurs there is a danger that, in wet conditions, a pool of water surrounding the parking lot power pedestal will become energized with electricity, thereby creating an electric shock hazard. What is required is a parking lot power pedestal that will address this safety concern.

SUMMARY

There is provided a parking lot power pedestal which includes a base and an elongated round tubular body which extends vertically relative to the base. The tubular body has a first end, a second end and a central bore that extends from the second end to the first end. A power receptacle is mounted to the first end of the tubular body. A single spring is provided which defines a central passage. The spring is disposed between the base and the second end of the tubular body. The spring flexes in response to a blow to enable the tubular body to be angularly offset relative to the base and the spring resiliently returns to its original state to reposition the tubular body in a position extending vertically relative to the base. The base has an opening configured to permit wires to pass through the central passage of the spring and through the central bore of the tubular body to the power receptacle. The spring has a first end providing a weather seal with the central bore at the second end of the tubular body. The spring has a second end providing a weather seal surrounding the opening of the base. The spring is tightly wound to provide a weather seal of the central passage of the spring, through which the wires pass.

With the parking lot power pedestal, described above, initial proto-types were built with a heavy wall pipe that was able to withstand repeated striking from automobiles. However, problems were encountered in arriving at a mounting system that would remain flexible in both summer and winter without regard to temperature and that would meet electrical safety concerns of protecting the wiring. The unique solution was to use a single tightly wound spring that could function as an integral part of the sealing system. The spring not only functions to permit angular movement of the tubular body relative to the base, it also excludes animals, provides a weather seal and protects the wires running through its central passage from ultra violet radiation. Unlike the prior art, when the tubular body moves, the base does not. The presence of the spring avoids having the base slide and shear the wires. When the base was fixed to the tubular body and the tubular body moved laterally in response to a blow, the base had to move laterally also. The presence of the spring avoids having the base tilt and expose the wires. When the base was fixed to the tubular body and the tubular body tilted at an angle in response to a blow, the base had to tilt at an angle also.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 3 is a front elevation view, partially in section, of the parking lot power pedestal of FIG. 1.

FIG. 4 is a right side elevation view of the parking lot power pedestal of FIG. 1, the left side elevation view being a mirror image.

FIG. 5 is a rear elevation view of the parking lot power pedestal of FIG. 1.

FIG. 6 is a top plan view of the parking lot power pedestal of FIG. 1.

FIG. 7 is a bottom plan view of the parking lot power pedestal of FIG. 1.

DETAILED DESCRIPTION

Figure 1:
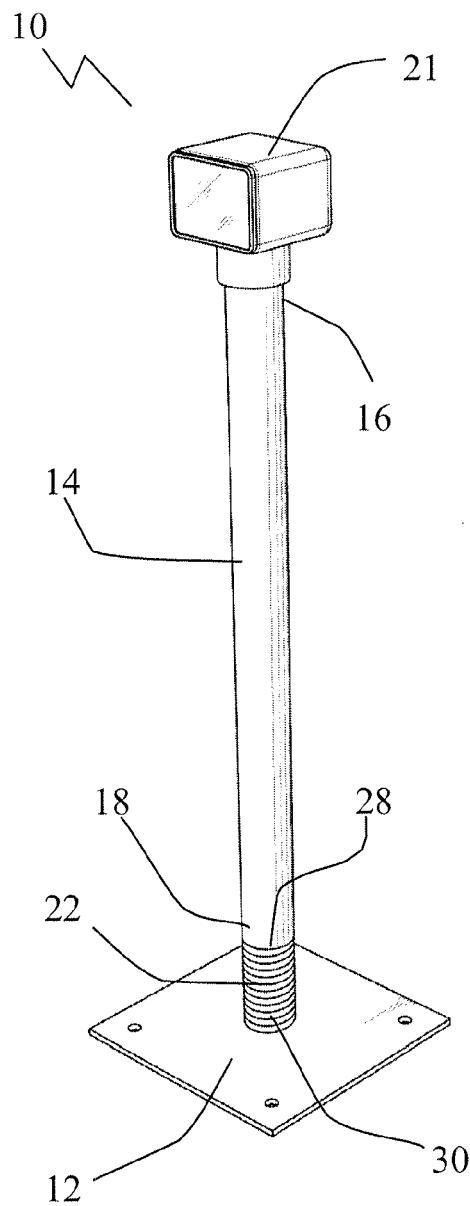
FIG. 1 is a front perspective view of a parking lot power pedestal.
Figure 2:
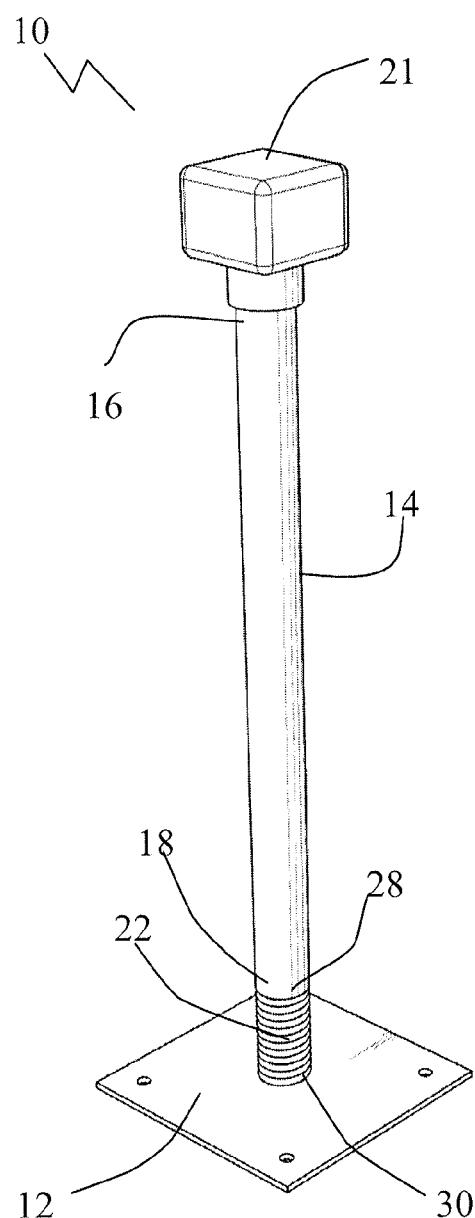
FIG. 2 is a rear perspective view of the parking lot power pedestal of FIG. 1.

A parking lot power pedestal generally identified by reference numeral 10, will now be described with reference to FIG. 1 through 7.

Structure and Relationship of Parts:

Referring to FIG. 1 through FIG. 6, parking lot power pedestal 10 includes a base 12 and an elongated round tubular body 14 extending vertically relative to base 12. Referring to FIG. 3, tubular body 14 has a first end 16, a second end 18 and a central bore 20 that extends from second end 18 to the first end 16. A power receptacle 21 is mounted to first end 16 of tubular body 14. A single spring 22 defines a central passage 24 which is disposed between base 12 and second end 18 of tubular body 14. Spring 22 flexes in response to a blow to enable tubular body 14 to be angularly offset relative to base 12 and spring 22 resiliently returning to its original state to reposition tubular body 14 in a position extending vertically relative to base 12. Referring to FIG. 7, base 12 has a central opening 26 configured to permit wires to pass through central passage 24 of spring 22 and through central bore 20 of tubular body 14 to power receptacle 21. Referring to FIG. 1 through FIG. 5, spring 22 has a first end 28 and a second end 30. First end 28 of spring 22 provides a weather seal with central bore 20 at second end 18 of tubular body 14. Second end 30 of spring 22 provides a weather seal surrounding central opening 26 of base 12. Spring 22 is tightly wound to provide a weather seal of central passage 24 of spring 22 through which the wires pass.

Operation:

Referring to FIG. 3, parking lot power pedestal 10 must be wired prior to be installed into position with wires being passed through central opening 26 of base 12, central passage 24 of spring and central bore 20 of tubular body 14. Parking lot power pedestal 10 is then positioned in a location chosen by the installer such that base 12 is fixed to the ground by pegs, screws or any other suitable attachment and tubular body 14 is relatively perpendicular to base 12. In the event of a blow to power receptacle 21 or tubular body 14, spring 22 flexes to cause tubular body 14 to be angularly offset relative to base 12 and helps to prevent damage to power pedestal 10. Spring 22 resiliently returns tubular body 14 to its original state perpendicular to base 12. As parking lot power pedestal is an electrical appliance, the weather seal to protect the wires is of critical importance. This weather seal protects against weather, and also against deterioration due to ultra violet radiation and damage from animals, such as rodents. First end 28 of spring 22 provides a weather seal with central bore 20 at second end 18 of tubular body 14. Second end 30 of spring 22 provides a weather seal surrounding central opening 26 of base 12. Spring 22 is tightly wound to provide a weather seal of central passage 24 of spring 22 through which the wires pass.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The scope of the claims should not be limited by the preferred embodiments set forth in the examples, but should be given a broad purposive interpretation consistent with the description as a whole.

What is claimed is:

1. A parking lot power pedestal, comprising:
   a base;
   an elongated round tubular body extending vertically relative to the base, the tubular body having a first end, a second end and a central bore that extends from the second end to the first end;
   a power receptacle mounted to the first end of the tubular body;
   a single spring defining a central passage, the spring being disposed between the base and the second end of the tubular body, the spring flexing in response to a blow to enable the tubular body to be angularly offset relative to the base and the spring resiliently returning to its original state to reposition the tubular body in a position extending vertically relative to the base;
   the base having an opening configured to permit wires to pass through the central passage of the spring and through the central bore of the tubular body to the power receptacle;
   the spring having a first end providing a weather seal with the central bore at the second end of the tubular body, the spring having a second end providing a weather seal surrounding the opening of the base, the spring being tightly wound to provide a weather seal of the central passage of the spring through which the wires pass.

* * * * *